US007638173B2

United States Patent
Richert et al.

(10) Patent No.: US 7,638,173 B2
(45) Date of Patent: Dec. 29, 2009

(54) METHOD FOR OPERATING AN IN-LINE COATING INSTALLATION

(75) Inventors: Holger Richert, Bruchkobel (DE); Manfred Weimann, Alzenau (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 511 days.

(21) Appl. No.: 10/806,060

(22) Filed: Mar. 22, 2004

(65) Prior Publication Data

US 2005/0186346 A1   Aug. 25, 2005

(30) Foreign Application Priority Data

Feb. 21, 2004   (DE) .................. 10 2004 008 598

(51) Int. Cl.
*B05D 3/00* (2006.01)
*B05C 5/00* (2006.01)
*C23C 16/00* (2006.01)
*C23C 14/00* (2006.01)

(52) U.S. Cl. .............. 427/444; 427/445; 427/248.1; 427/294; 204/192.1; 118/715

(58) Field of Classification Search .............. 427/248.1, 427/445, 294; 204/192.1; 118/715
See application file for complete search history.

(56) References Cited

U.S. PATENT DOCUMENTS

| 4,274,936 | A | * | 6/1981 | Love ..................... 204/192.13 |
| 4,405,435 | A | * | 9/1983 | Tateishi et al. ......... 204/298.25 |
| 5,288,329 | A | * | 2/1994 | Nakamura et al. .......... 118/729 |
| 5,753,092 | A | | 5/1998 | Hollars et al. |
| 2002/0020496 | A1 | * | 2/2002 | Shinohara et al. ........... 156/345 |
| 2002/0078892 | A1 | * | 6/2002 | Takahashi ................... 118/719 |

FOREIGN PATENT DOCUMENTS

| DE | 30 16 069 | 11/1980 |
| DE | 200 22 564 U1 | 1/2002 |
| JP | 63100181 | 5/1988 |
| JP | 2002 309372 A | 10/2002 |

* cited by examiner

Primary Examiner—Timothy Meeks
Assistant Examiner—Kelly M Gambetta
(74) *Attorney, Agent, or Firm*—Fulbright & Jaworski L.L.P.

(57) ABSTRACT

A method for the operation of an in-line coating configuration comprising 2n+1 chambers, where n is an integer, and specifically is preferably 2. Thus, at least between two times two chambers of this installation one gate each can be opened and closed, it is possible to coat also overdimensioned substrates with the same installation. The opening and closing of the gates entails a change of the pressure courses in comparison to standard operation.

21 Claims, 3 Drawing Sheets

METHOD FOR OPERATING AN IN-LINE COATING INSTALLATION

BACKGROUND OF THE INVENTION

This application claims priority from German 10 2004 008 598.6 filed Feb. 21, 2004, which is hereby incorporated by reference in its entirety.

FIELD OF THE INVENTION

The invention relates to a method for the operation of an in-line coating installation.

In order to coat substrates, sputtering installations are utilized, in which particles are sputtered off so-called targets under vacuum conditions, and the particles are subsequently deposited on the substrate.

If, in the process, the substrates are continuously transferred through an interlock into the sputtering installation and again transferred out of it through an interlock, one speaks of an in-line coating installation or also of a "pass-through" coating installation.

Such an installation is comprised either of a linear configuration of relatively small, but interconnected, individual chambers or of one or two large chambers with vacuum transition lockings at each end of the line. The process chambers are provided either along one large chamber or in each individual chamber.

DESCRIPTION OF RELATED ART

An in-line sputtering system is already known, which comprises three concentric cylinders, with the inner and the outer cylinder forming an annular chamber with cylindrical walls (U.S. Pat. No. 5,753,092). A central cylinder, disposed between the inner and the outer cylinder, has openings supporting substrates and serves as a cylindrical support, which substantially fills the annular transit chamber and which is stepwise rotatable.

An arrangement is furthermore known for the defect-free coating of substrates with a coating segment, which includes a vacuum coating section and an entrance and exit interlock (DE 200 22 564 U1). In addition, a carrier is here provided, which includes a carrier insert for receiving the substrates. The carrier path is implemented as a closed path.

In order to save space in an in-line coating installation, it is known to reduce the number of required supports by providing a return chamber (JP 2002309372 A). The supports move here with the substrates into a first direction, rotate about 180 degrees and subsequently move into a second direction.

The chambers of the known arrangements are tailored to specific sizes of the substrates. If oversized substrates are to be worked, different arrangements with larger chambers must be used.

SUMMARY OF THE INVENTION

The invention therefore addresses the problem of being able to coat normal substrates as well as also oversized substrates with only one coating installation.

This problem is solved by the present invention, which relates to a method for the operation of an in-line coating configuration comprised of 2n+1 chambers, where n is an integer and specifically preferably 2. By being able to open and close at least one gate between two times two chambers of this installation, it also becomes possible to coat oversized substrates with the same installation. In comparison to standard operation, opening and closing the gates entails a change of the pressure courses.

The advantage attained with the invention comprises in particular better utilization of available installations.

Embodiment examples of the invention are shown in the drawing and will be described in further detail herein and by the drawings

DETAILED DESCRIPTION

Figure 1:
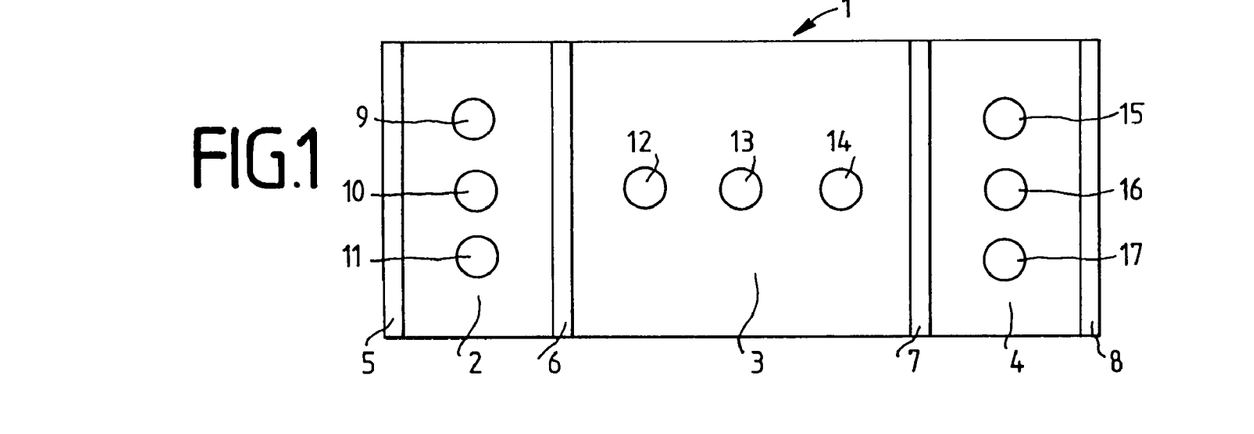
FIG. 1 a three-chamber coating installation in a side view.

FIG. 1 shows a coating installation 1 in a side view. This coating installation 1 comprises three chambers: an inward transfer chamber 2, a process chamber 3 and an outward transfer chamber 4. Between the different chambers 2, 3, 4 and at the entrance of chambers 2, 4 are located a total of four gates, which can be opened and closed vacuum-tight. In FIG. 1 the gates themselves are not visible, but extension pieces 5 to 8, which indicate the positions of the gates. The substrates to be coated, for example flat architectural glass, metal plates, Si wafers, synthetic material plates and the like, are introduced at the inward transfer chamber 2, subsequently coated in the process chamber 3, to be subsequently guided out via the outward transfer chamber 4. The substrates can be moved with or without support through the chambers 2, 3, 4. However, in any event a transport system for the transport of the substrates is provided in chambers 2, 3, 4.

By 9 to 17 are denoted pumps, which evacuate the chambers 2, 3, 4 to a specified pressure value. The pumps are here disposed on the side walls of the chambers. However, they can also be disposed on the ceilings of the chambers.

The size of the chambers 2 to 4 is determined by the maximum substrate dimension, which, for example in the case of architectural glass, is 2.54 m×3.66 m or 3.21 m×6.00 m. The number of chambers is determined by the desired minimum cycle time. By cycle time is understood that time which elapses from the input of a first substrate into the chamber 2 until the input of a second substrate into the same chamber 2. As a rule, for a cycle time of up to approximately 90 seconds, a so-called three-chamber principle is used, such as is shown in FIG. 1.

With the gate open, a substrate is herein introduced at extension piece 5 into chamber 2, whose internal pressure subsequently, with the gate then closed again at extension piece 5 and the gate at extension piece 6 closed, is reduced for example to 0.05 mbar through the pumps 9 to 11. The movement of the substrate, which can be located as a rule on a support or carrier, is discontinuous, since the gate at extension piece 6 is also initially closed and the substrate must be brought to a standstill by this gate.

When the pressure in the inward transfer chamber 2 has reached the specified value of, for example, 0.05 mbar, the gate at extension piece 6 is opened and the substrate is moved continuously through chamber 3, in which a vacuum obtains. In this chamber 3 the coating is subsequently carried out. After the coating, the substrate is transferred to the outside through the outward transfer chamber 4.

The cycle times in a three-chamber coating installation are relatively long, since the substrate must remain in the inward transfer chamber 2 for a relatively long time, in order for the specified low pressure to be reached in the chamber.

Figure 2:
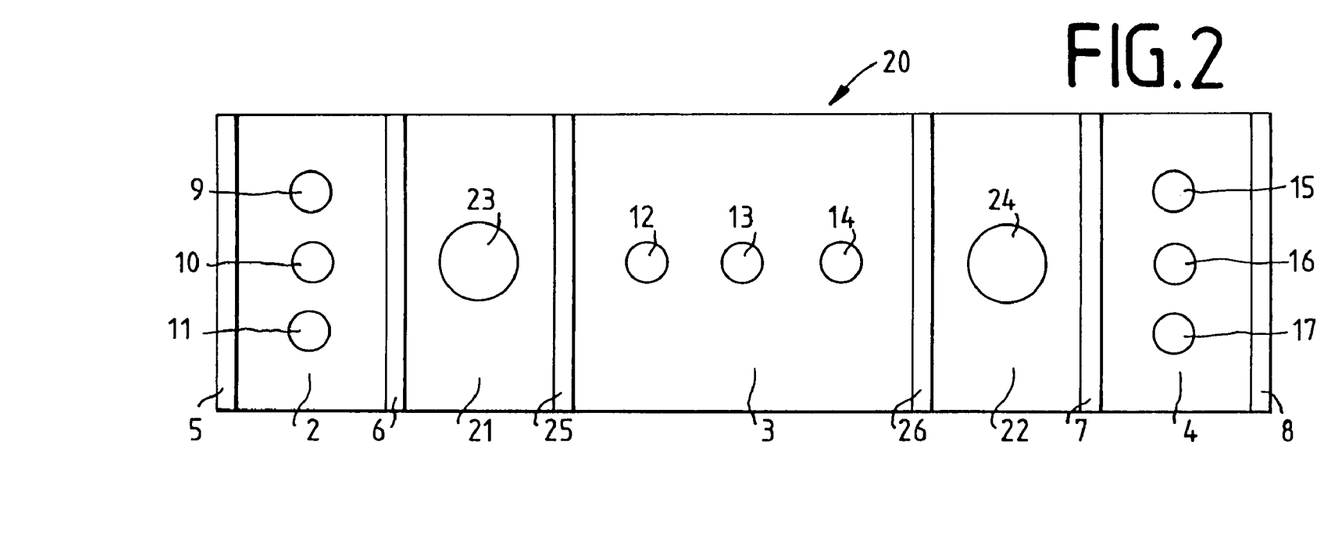
FIG. 2 a five-chamber coating installation in a side view.

Shorter cycle times are attained with a five-chamber coating installation 20, such as is depicted in FIG. 2. Compared to the three-chamber coating installation 1, this five-chamber coating installation 20 comprises two additional buffer chambers 21, 22 at the extension pieces 25, 26 with corresponding pumps 23, 24. Since the substrates in a five-chamber coating installation 20 can be moved more rapidly through the chambers 2, 21, 3, 22, 4, the cycle times are shorter. This faster movement is due to the fact that the evacuation of chambers 2, 21 or 22, 4 takes place differently than that of chambers 2, 4 in the three-chamber system of FIG. 1.

In the case of the five-chamber coating installation 20, the substrates are moved discontinuously into the inward transfer chamber 2 at the timing of the installation, with the pressure in the inward transfer chamber 2 being reduced to approximately 15 mbar, thus not to 0.05 mbar as in the three-chamber installation. With the next timing the substrates are transferred through an interlock into the buffer chamber 21, and the pressure in the buffer chamber 21 is brought close to the pressure in the process chamber 3. After the substrates have been moved continuously through the process chamber 3, they are brought to the outside via the buffer chamber 22 and the outward transfer chamber 4, where atmospheric pressure obtains.

In the case of the five-chamber coating installation 20 the cycle time is reduced to less than 90 seconds essentially thereby that the inward transfer process of a substrate into the coating installation is divided over the inward transfer chamber 2 and the buffer chamber 21 and, consequently, can take place in both chambers in parallel, i.e. after a substrate has been transported from the inward transfer chamber 2 into the buffer chamber 21, it is already possible to bring another substrate into the inward transfer chamber 2. In order to be able to introduce a substrate into the process chamber 3, the pressure in the chamber, which is in front of the process chamber 3, must be reduced to approximately 0.05 mbar. In the three-chamber coating installation 1 this pumping-down to 0.05 mbar takes place exclusively in the inward transfer chamber 2.

In contrast, in the case of the five-chamber coating installation 20, the pressure in the inward transfer chamber 2 is only pumped from atmospheric pressure to approximately 15 mbar and the substrate to be worked is subsequently transferred into the buffer chamber 21. When the gate at extension piece 6 between the inward transfer chamber 2 and the buffer chamber 21 is opened, the pressure is equalized. The pressure is markedly lower than 0.05 mbar in the buffer chamber 21, which previously was open toward the process chamber 3, in which, for example a pressure of $3 \times 10^{-3}$ mbar obtains. Consequently, the buffer chamber 21 itself initially does not need to be pumped to a lower pressure value at all. Thereby that the inward transfer chamber 2, in which a pressure of 15 mbar obtains, after the gate at extension piece 6 has been opened, is connected with the buffer chamber 21, in which a pressure of only $3 \times 10^{-3}$ mbar obtains, the total pressure in both equally dimensioned chambers 2 and 21 decreases to a mean pressure value of approximately 7 mbar. After the gate at extension piece 6 has been closed, the pressure in the buffer chamber 21 is now reduced by means of pumping from approximately 7 mbar to approximately 0.05 mbar. While a substrate is brought from the buffer chamber 21 into the process chamber 3, the inward transfer process for the next substrate can already be started again in the inward transfer chamber 2 after the inward transfer chamber 2 has been flooded and subsequently the gate at extension piece 5 has been opened. Due to the opening, atmospheric pressure obtains again in the inward transfer chamber 2, which subsequently is again pumped down to approximately 15 mbar. Consequently, the pressure of the inward transfer chamber 2 fluctuates between atmospheric pressure and approximately 15 mbar. In contrast, the buffer chamber 21 only experiences a pressure change from 7 mbar to 0.05 mbar.

When pumping down a chamber of a vacuum installation, the pressure reduction takes place according to an exponential function. The pressure change from approximately 1000 mbar to approximately 15 mbar takes place relatively rapidly. In contrast, the further pumping to lower pressures, such as for example 0.05 mbar, takes longer.

Different types of vacuum pumps, such as for example vane-type rotary pumps, Roots pumps or turbomolecular pumps, have their optimum evacuation performance in different pressure ranges. Vane-type rotary pumps evacuate from atmospheric pressure to approximately 0.005 mbar. But to attain this end pressure requires a very long pumping time. Roots pumps can be employed highly variably and have their optimum evacuation performance in the range from 1-0.1 mbar. Turbomolecular pumps are only connected in below 0.1 mbar, but they only have a useful evacuation performance below $10^{-2}$ mbar.

Pumps 9 to 17, or 9 to 17 and 23, 24, are selected according to the task they have to perform. The pumps for the inward transfer chamber 2 and the buffer chamber 21 can be laid out such that the pumping times for both chambers 2, 21 are approximately equal.

The inward transfer chamber 2 of the three-chamber installation 1 is evacuated by means of pumps 9 to 11, which are vane-type rotary and Roots pumps. The Roots pumps increase the evacuation performance in the lower pressure range to the switching point of 0.05 mbar, starting at which the gate at extension piece 6 toward the process chamber 3 is opened. Typical cycle times are here 60-90 sec at a pumping time of approximately 30-60 sec.

However, the inward transfer chamber 2 of the five-chamber installation 20 is evacuated by means of pumps 9 to 11, which are exclusively vane-type rotary pumps. The pump station 23 for the buffer chamber 21 can include vane-type rotary and Roots pumps. During conventional five-chamber operation the cycle time is approximately 45 sec at a pumping time of 15-20 sec. The difference between cycle time and pumping time is needed inter alia for moving the glass plates and for opening and closing the gates.

Figure 3:
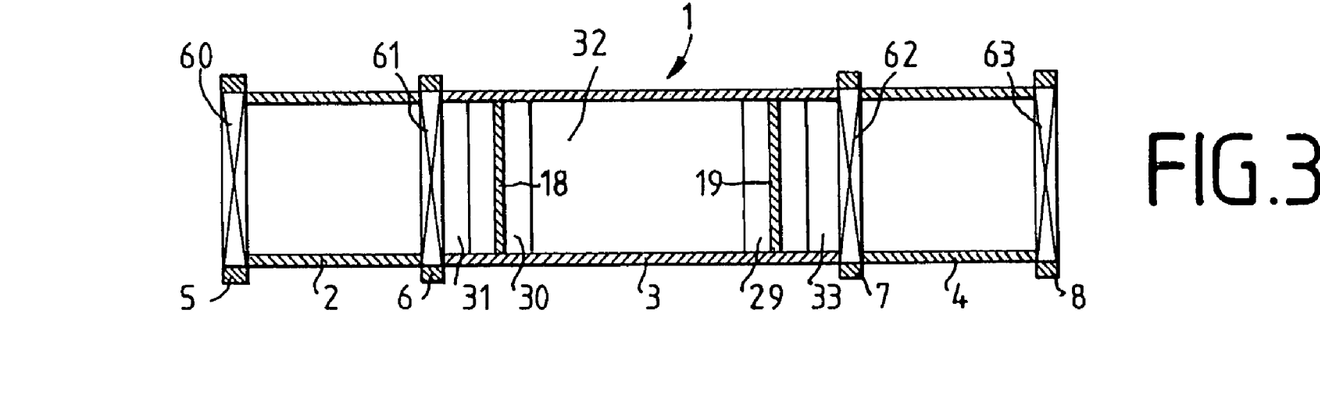
FIG. 3 a three-chamber coating installation in plan view.
Figure 4:
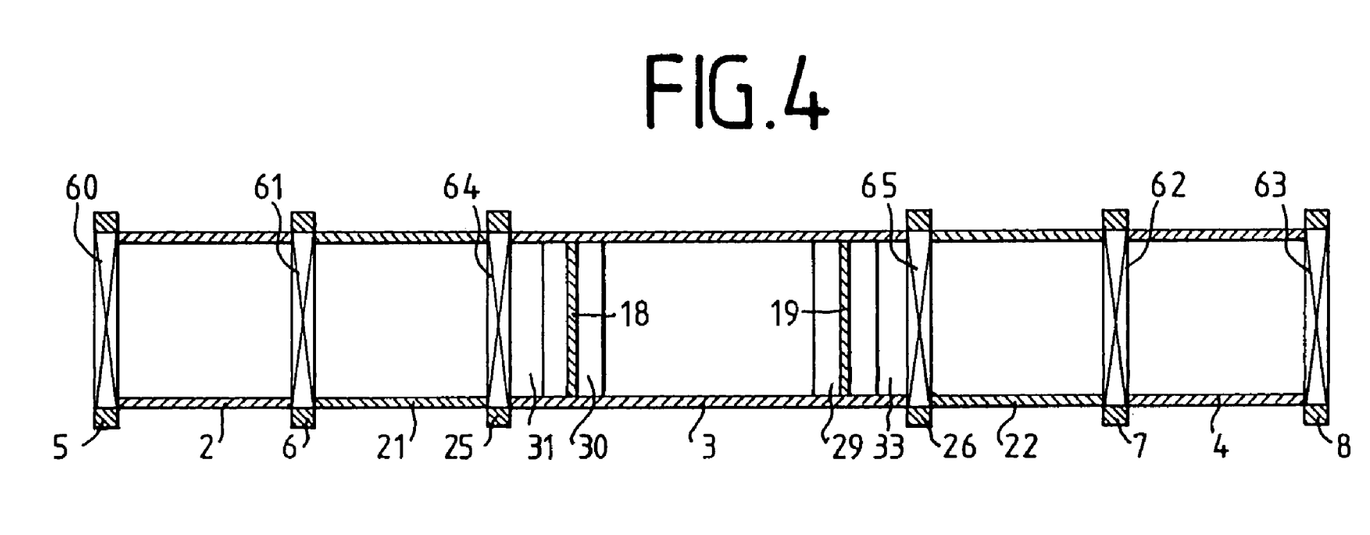
FIG. 4 a five-chamber coating installation in plan view.

In FIG. 3 the three-chamber coating installation 1 is shown once again in plan view, while FIG. 4 shows the five-chamber coating installation 20 in plan view.

In FIG. 3 can be seen the chambers 2, 3, 4 as well as the extension pieces 5, 6, 7, 8 with the associated gates 60, 61, 62, 63. In addition, in the process chamber 3 can be seen two slit diaphragms 18, 30 or 19, 29, which define transfer chambers 31, 33. By 30, 29 are denoted slit diaphragms, which are disposed perpendicularly on sheet metal parts 18, 19.

FIG. 4 shows the five-chamber installation in plan view. This five-chamber installation comprises two additional gates 64, 65, which are located between the chambers 21, 31 and 33, 22, respectively.

During standard operation, i.e. when no excessively long substrates are being coated, in the installation 20 according to FIG. 4, the following pumping processes are carried out: inward transfer chamber 2 is flooded, gate 60 is opened and a substrate is transported into the inward transfer chamber 2. Thereupon gate 60 is closed again. After reaching the pressure switching point of approximately 15 mbar in chamber 2, gate 61 is opened again and the substrate is transported into chamber 21. Hereupon gate 61 is again closed. While in the buffer chamber 21 the pressure is reduced to approximately 0.05 mbar, the inward transfer chamber 2 is flooded and subsequently gate 60 is opened. A new substrate is now introduced into inward transfer chamber 2 and gate 60 closes again. In parallel, upon reaching the pressure switching point of approximately 0.05 mbar in the buffer chamber 21, gate 64 is opened and the first substrate moved via the transfer chamber 31 into the process chamber 3. In general, during this operation always only one of gates 60, 61, 64 is opened. It should be pointed out that valves are disposed between the chambers and the pumps as well as between the chambers and the atmospheric environment. To switch off the pumping power, a valve between chamber and pump is closed; but the pumps continue to run continuously. During the flooding of a chamber, the valve in front of the chamber toward the ambient air is opened, such that air can flow into the chamber and the pressure in this chamber rises to atmospheric pressure.

During standard operation of the five-chamber installation according to FIG. 4, consequently, the chamber 2 is pumped down from atmospheric pressure to approximately 15 mbar, and, when opening gate 61, a pressure equalization takes place, since the pressure in chamber 21, which previously had been open toward chamber 3 (approximately $3 \times 10^{-3}$ mbar) is markedly lower than 0.05 mbar. Thereby the total pressure in both equally dimensioned chambers 2, 21 decreases to approximately 7 mbar. Chamber 21 is subsequently pumped from approximately 7 mbar to approximately 0.05 mbar. The Roots pumps in chamber 21 can work without interruption, since the pressure in this chamber varies only between approximately 7 mbar and less than 0.05 mbar.

During standard operation of the five-chamber installation 20, the transport systems only run synchronously during the transfer of the substrate from the inward transfer chamber 2 into the buffer chamber 21. During the remaining movement phases both transport systems can transport the particular substrates independently of one another.

Figure 5:
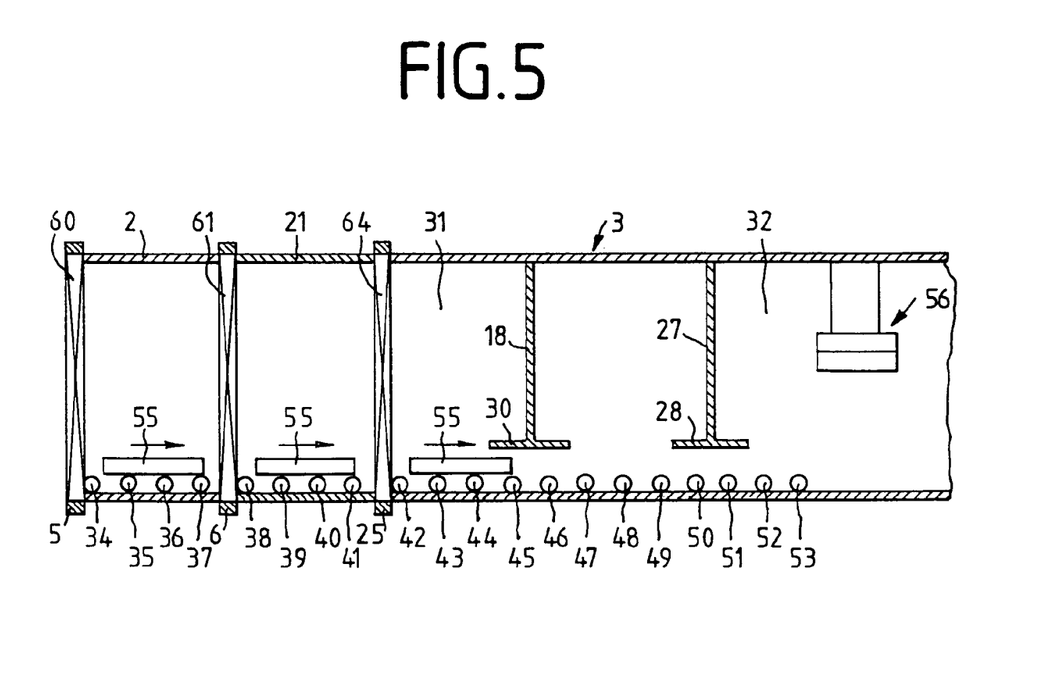
FIG. 5 a portion of a five-chamber coating installation in a sectioned side view.

On the left hand side of FIG. 5 an installation similar to installation 20 according to FIG. 4 is shown once again in section. The installation differs from that of FIG. 4 thereby that, in addition to the slit diaphragm 30, it has a further slit diaphragm 28. Rollers or cylinders 34 to 37 in the inward transfer chamber 2 are evident, rollers or cylinders 38 to 41 in the buffer chamber 21 and rollers or cylinders 42 to 53 in the process chamber 3. On these rollers or cylinders is disposed a substrate 55, which is moved from the left to the right.

The slit diaphragms 30, 28 are suspended on metal sheets 18, 27 and on their underside leave open a slit, which is of such a size that the substrate 55 can be guided past under the slit diaphragm. In the process chamber 32 proper is located a sputter cathode 56. The substrate 55 is coated with the particles sputtered of this cathode.

The slit diaphragms 30, 28 extend over the entire depth of the process chamber 3. This applies also to the suspensions 18, 19 of these slit diaphragms.

To improve the gas separation between the chambers, the transport system can additionally be covered with a metal sheet not shown in FIG. 5, from which projects only the upper portion of the transport rollers.

The substrate transport arrangement consequently comprises many rollers or cylinders 34 to 53, which rotate at the same number of rotations and transport the substrates. At those sites at which the gates 61, 64, 65, 62 are provided, the transport arrangement has interruptions or greater spaces between the rollers or cylinders. The sections of the transport arrangement in chambers 2, 21, 22 and 4 operate intermittently, the section in chamber 3 operates continuously.

In standard operation the substrate transport in the five-chamber installation with reference to FIGS. 4 and 5 operates as follows: the transport arrangement in chamber 2 is switched on, in order to transfer the substrate 55 inwardly. Once the substrate 55 has reached its specified position in chamber 2, the transport is switched off. To transfer the substrate 55 from chamber 2 to chamber 21, both transport arrangements with cylinders 34 to 37 or 38 to 41 operate simultaneously and are only switched off when the substrate 55 has reached its end position in chamber 21. To transport the substrate 55 into chamber 3, the transport device 38 to 41 in chamber 21 is switched on, the transport arrangement 42 to 53 in chamber 3 is running in any event without interruption. For the transfer from chamber 3 to chamber 22 (FIG. 2) the transport arrangement located there is switched on simultaneously with the opening of gate 65. The further outward transfer process takes place analogously to the inward transfer process but in reverse sequence.

The inward transfer chamber 2 is evacuated with a pump station, which only comprises vane-type rotary pumps, however, the pump station for chamber 21 includes vane-type rotary and Roots pumps. During the flooding of a chamber, the pump is not switched off but rather a valve between the chamber and the pump is closed.

Up to this point the functions known per se of a three-chamber installation 1 and a five-chamber installation 20 have been described.

With reference to FIGS. 4 and 5, in the following the manner is described in which with the aid of a five-chamber installation relatively large substrates can also be coated according to the invention.

To both installations 1 or 20 applies that the maximally permitted substrate dimension is a function of the dimensions of the particular chambers. Substrates, which are larger than the chambers 2 and 21 or 22 and 4 cannot be coated. Furthermore applies that the chambers are developed as modules with identical dimensions.

As is evident in FIG. 4, larger substrates could be treated if the gates 61, 63 were open. In this case the chambers 2 and 21 as well as 4 and 22 would in each instance together form a larger space, in which in this case also a larger substrate could be accommodated.

For the interlock chambers 2, 21, 22, 4 the same modules in the same size are utilized, independently of whether or not a three-chamber installation 1 or a five-chamber installation 20 is involved. Since with both installations 1 or 20 normally the same substrates with the same maximum size are coated, the chambers must also have these dimensions.

If it is assumed that the inward transfer, buffer and outward transfer chamber are all of equal size, since they are developed as modules, substrates of the twofold length can be worked if the gates 61, 62 are open. The working, in particular coating, of occasionally demanded special dimensions, of for example more than 6 m length and 3.21 m width, would consequently also be possible in coating installations with standard chamber sizes.

In conjunction with these FIGS. 3 and 4, the switching-over process according to the invention from five-chamber coating to three-chamber coating will be explained.

In order to switch from five-chamber operation to three-chamber operation, it is not sufficient to open only gates 61 and 62 between the inward transfer chamber 2 and the buffer chamber 21 or the outward transfer chamber 4 and the buffer chamber 22. Rather, the pumping sequence and the drive control must be adapted to the new condition. Consequently considerable changes are necessary in the inward transfer procedure. As already described, the inward transfer of a substrate in the three-chamber coating installation 1 takes place by pumping down the inward transfer chamber 2 by means of pumps 9 to 11 to a pressure of approximately 0.05 mbar. In order to evacuate the inward transfer chamber 2 from atmospheric pressure to transfer pressure, rather long pumping times are required. Since the gate 61 to the process chamber 3 is opened when a substrate is transferred into the process chamber, gases can enter at too high a pressure into the process chamber 3, which is only permitted to have a pressure of $3 \times 10^{-3}$ mbar. To prevent such, an increased number of pumps 12 are disposed in the entrance area of the process chamber 3, of which only one pump 12 is depicted in FIG. 1. This entrance area is separated by means of a slit diaphragm 18, 30 from the process area 32 proper. This entrance area is also denoted as transfer chamber 31, even though it is only separated from the process chamber 3 by the slit diaphragm 18, 30 but not by gates. The process chamber 3 consequently is comprised of a transfer area 31, a process area 32 and a further transfer area 33 in front of the outward transfer chamber 4, with a further slit diaphragm 19, 29 being provided between the transfer area 33 and the process area.

That section 31 of the process chamber, which is evacuated via several turbo pumps 12, is denoted as "transfer section". The process chamber 32 proper is combined of many individual segments of equal size, and, depending on the requirement, the number of segments added to one another is such that therein the particular tasks can be carried out. In the case of a three-chamber installation 1 in the inward transfer chamber 2 a pressure of 0.05 mbar obtains, such that when gate 61 is opened, gas flows over into the process chamber 32, since here the pressure is approximately $3 \times 10^{-3}$. This pressure surge is absorbed in the "transfer section" of the process chamber 3 by the high evacuation performance of several turbo pumps.

During special operation for overlong substrates, i.e. when the five-chamber installation 20 is operated as a three-chamber installation 1, the following processes take place in the five-chamber installation according to FIG. 4: chambers 2 and 21 are flooded. Gate 60 is opened. Gate 61 always remains open in this operating state, since otherwise the substrate would be destroyed. A substrate is transported into chambers 2 and 21, subsequently gate 60 is closed again. After reaching the pressure switching point of approximately 0.05 mbar, gate 64 is opened, the substrate is transported into the process chamber 3 and gate 64 is closed again. After flooding chambers 2 and 21, gate 60 is opened again in order to transfer in another substrate.

The particular outward transfer process takes place analogously but in reverse sequence, i.e. the substrate is first in the outward transfer chamber 22, subsequently flooding is carried out and subsequently the opening of gate 63 to atmospheric pressure occurs.

It is thus not sufficient in the five-chamber installation 20 to open the gates 61, 62 between the two chambers 2, 21 and 4, 22, respectively, in order to be able to work substrates, preferably glass plates, having excessive lengths. It is moreover necessary to adapt the pumping programs for the two chambers 2, 21 and 22, 3, such that only both chambers 2, 21 and 22, 4 are pumped down from atmospheric pressure to approximately 0.05 mbar. While this extends the inward transfer time, and consequently the overall cycle time, of the installation, however, in this way it is possible to work at least substrates with overlengths without a larger installation having to be built.

With special operation for overlong substrates, the pumping in the five-chamber installation in detail takes place in the following steps: chambers 2 and 21 together are both pumped down from atmospheric pressure to approximately 0.05 mbar. For this purpose in the pumping program for chamber 2 the pressure switching point must be lowered from 15 mbar to 7 mbar. The pump set for chamber 2 in this case pumps only from atmospheric pressure to 7 mbar, subsequently the valve between pump set and chamber 2 is closed, but simultaneously the valve between the second pump set and chamber 21 is opened, which previously had been closed. The reason is that the pump set of chamber 2 is comprised of vane-type rotary pumps, which are capable of pumping down from atmospheric pressure. Apart from vane-type rotary pumps, the pump set of chamber 21 includes also Roots pumps, which must only be connected in starting at approximately 7 mbar. In order to be able to pump the increased inward transfer chamber 2+21 down to approximately 0.05 mbar, consequently both pump sets are utilized successively and do not operate in parallel as in standard operation.

Flooding and pumping-down of chambers 22 and 4 take place analogously.

The transport system for the substrates must, moreover, be adapted to another inward transfer sequence.

If the five-chamber installation 20 is utilized for coating overlong substrates, the transport systems during the inward transfer process must operate synchronously as a single system, since otherwise scratches would be generated on the substrates. If the substrate is pushed from one section of the transport system onto another section, which is not switched on, either the rotating rollers on the substrate underside drag or the plate is pushed over the non-rotating rollers and in both cases scrape marks are generated.

During special operation for overlong substrates 55 the transport in the five-chamber installation according to FIG. 4, 5 takes place as follows: while in standard operation the transport arrangements 34 to 37 and 38 to 41, respectively, in chambers 2 and 21 operate synchronously or independently of one another depending on the requirement, both arrangements are now treated as if they were a single coherent transport arrangement. Reaching the end position of substrate 55 in chamber 2 must be ignored, i.e. it must travel through until the end position in chamber 21. In this case there is no operating state in which the individual sections of the transport arrangement in chambers 2 and 21 operate independently of one another. The further substrate transport takes place analogously.

The control of the pumps, transport rollers, gates, etc. preferably takes place by means of a stored programmable control (SPS), which is commercially available in the form of a control computer.

With such a control even extremely large industrial installations can be controlled with flexible programs (SPS program sequence). All measuring systems, limit switches, sensors, motors, valves and controls, etc., which are part of the installation, are connected to the inputs and outputs of the control computer. The installation control proper is taken over by the program, which connects these inputs and outputs with one another through logic links and places the necessary actions into the correct time sequence. If an above described installation is to be controllable in different operating states, no significant hardware changes are necessary. If, instead of pressure cells with fixed switching points, flexibly programmable pressure sensors are utilized, only the necessary new logic linkages querying the changed pressure switching points must be stored in alternative program sequences and be separately addressable.

For the inward transfer of a substrate no exact pressure measurement is required, the signal of a sensor is sufficient, which indicates that the desired pressure (for example 15 mbar) has now been reached. Previously pressure cells were utilized for this purpose, which had a fixed pressure switching point. If alternative pressure switching points were required, additional pressure cells had to be installed, which were set to these pressure points. Today an electronic pressure meter is sufficient, whose measurement value in the SPS program is only queried as to whether or not the desired pressure had been reached at the particular program location.

The concept of the invention can in principle also be applied to 2 n+1 chamber installations, where n is an integer. A seven-chamber installation is also realizable in practice. In installations with even more chambers, the expenditures would no longer represent a reasonable relationship to the possible shortening of the cycle time and consequently to the increase of productivity.

The invention claimed is:

1. A method for the operation of an in-line coating installation having an inward transfer chamber, an adjoining buffer chamber, a process chamber adjoining thereon, a further buffer chamber adjoining it and an outward transfer chamber adjoining it, with gates provided between the chambers, which can be opened and closed, and where the inward transfer chamber, the buffer chamber and the outward transfer chamber are developed as modules having identical dimensions and for receiving substrates selected from the group consisting of flat architectural glass, a metal plate, an Si wafer, a synthetic material plate and the like up to a specified maximum size, wherein for the coating of the substrates, which are greater than the modules, the gate between the inward transfer chamber and the buffer chamber as well as the gate between the buffer chamber and the outward transfer chamber are opened and the pressure conditions of the buffer chambers and of the inward transfer or outward transfer chamber are adapted to one another.

2. The method of claim 1, wherein the chambers are equipped with their own transport arrangements for substrates and the transport rates of these transport arrangements are matched to one another.

3. The method of claim 1, wherein the process chamber comprises at least two slit diaphragms, of which the one slit diaphragm forms a left boundary of the process chamber and the other slit diaphragm a right boundary of the process chamber.

4. The method of claim 1, wherein
the gate at the entrance to the first buffer chamber and the gate between the second buffer chamber and the outward transfer chamber are opened;
the gate at the entrance of the inward transfer chamber is opened;
a substrate of a length exceeding the length of the inward transfer chamber or of the buffer chamber is transported into the inward transfer chamber and the buffer chamber;
the gate at the entrance of the inward transfer chamber is closed; the space formed by the inward transfer chamber and, with the gate at the entrance to the process chamber closed,
the buffer chamber is evacuated to a specified pressure;
upon reaching a specified pressure, the gate at the entrance of the process chamber is opened;
the substrate is transported into the process chamber and the gate at the entrance of the process chamber is closed again;
the substrate is worked in the process chamber; the gate at the exit of the process chamber is opened;
the worked substrate is moved into the space formed of the buffer chamber and the outward transfer chamber; the gate at the exit of the process chamber is closed;
the gate at the exit of the outward transfer chamber is opened;
the worked substrate is moved to the outside;
and the gate at the exit of the outward transfer chamber is closed.

5. The method of claim 4, wherein after the inward transfer of the substrate into the space formed of the inward transfer chamber and buffer chamber and, after the gate is closed, first the pumps associated with the inward transfer chamber carry out an evacuation from atmospheric pressure to a first specified pressure, and that subsequently the pumps associated with the buffer chamber carry out an evacuation to a pressure corresponding approximately to the pressure of the process chamber.

6. The method of claim 5, wherein the pressure in the space formed of the inward transfer chamber and buffer chamber is lowered from atmospheric pressure first to approximately 7 mbar and, subsequently, the pressure in the same space is decreased to approximately 0.05 mbar.

7. The method of claim 1, wherein the transport arrangement of the inward transfer chamber and the transport arrangement of the adjoining buffer chamber are operated synchronously.

8. The method of claim 7, wherein the transport arrangement of the process chamber is operated at the same rate as the transport arrangements of the inward transfer chamber and the buffer chamber.

9. The method of claim 1, wherein in all chambers pressure meters are provided, whose pressure is queried by a control, and that this control carries out a switching action when specified pressures are reached.

10. The method of claim 9, wherein the switching action is the opening or closing of gates or the opening or closing of valves disposed between chamber and pump.

11. A method for the operation of an in-line coating installation having an inward transfer chamber, an adjoining buffer chamber, a process chamber adjoining thereon, a further buffer chamber adjoining it and an outward transfer chamber adjoining it, with gates provided between the chambers, which can be opened and closed, and where the inward transfer chamber, the buffer chamber and the outward transfer chamber are developed as modules having identical dimensions and for receiving a substrate of a specified maximum size, wherein for the coating of the substrates, which are greater than the modules, the gate between the inward transfer chamber and the buffer chamber as well as the gate between the buffer chamber and the outward transfer chamber are opened and the pressure conditions of the buffer chambers and of the inward transfer or outward transfer chamber are adapted to one another.

12. The method of claim 11, wherein the chambers are equipped with their own transport arrangements for substrates and the transport rates of these transport arrangements are matched to one another.

13. The method of claim 11, wherein the process chamber comprises at least two slit diaphragms, of which the one slit diaphragm forms a left boundary of the process chamber and the other slit diaphragm a right boundary of the process chamber.

14. The method of claim 11, wherein the gate at the entrance to the first buffer chamber and the gate between the second buffer chamber and the outward transfer chamber are opened; the gate at the entrance of the inward transfer chamber is opened; a substrate of a length exceeding the length of the inward transfer chamber or of the buffer chamber is transported into the inward transfer chamber and the buffer chamber; the gate at the entrance of the inward transfer chamber is closed; the space formed by the inward transfer chamber and, with the gate at the entrance to the process chamber closed, the buffer chamber is evacuated to a specified pressure; upon reaching a specified pressure, the gate at the entrance of the process chamber is opened;

the substrate is transported into the process chamber and the gate at the entrance of the process chamber is closed again; the substrate is worked in the process chamber; the gate at the exit of the process chamber is opened; the worked substrate is moved into the space formed of the buffer chamber and the outward transfer chamber; the gate at the exit of the process chamber is closed; the gate at the exit of the outward transfer chamber is opened; the worked substrate is moved to the outside; and the gate at the exit of the outward transfer chamber is closed.

15. The method of claim 14, wherein after the inward transfer of the substrate into the space formed of the inward transfer chamber and buffer chamber and, after the gate is closed, first the pumps associated with the inward transfer chamber carry out an evacuation from atmospheric pressure to a first specified pressure, and that subsequently the pumps associated with the buffer chamber carry out an evacuation to a pressure corresponding approximately to the pressure of the process chamber.

16. The method of claim 15, wherein the pressure in the space formed of the inward transfer chamber and buffer chamber is lowered from atmospheric pressure first to approximately 7 mbar and, subsequently, the pressure in the same space is decreased to approximately 0.05 mbar.

17. The method of claim 11, wherein the transport arrangement of the inward transfer chamber and the transport arrangement of the adjoining buffer chamber are operated synchronously.

18. The method of claim 12, wherein the transport arrangement of the process chamber is operated at the same rate as the transport arrangements of the inward transfer chamber and the buffer chamber.

19. The method of claim 11, wherein in all chambers pressure meters are provided, whose pressure is queried by a control, and that this control carries out a switching action when specified pressures are reached.

20. The method of claim 19, wherein the switching action is the opening or closing of gates or the opening or closing of valves disposed between chamber and pump.

21. The method of claim 11, wherein the substrate is selected from the group consisting of flat architectural glass, a metal plate, an Si wafer, and a synthetic material plate.

* * * * *

UNITED STATES PATENT AND TRADEMARK OFFICE
CERTIFICATE OF CORRECTION

PATENT NO. : 7,638,173 B2  Page 1 of 1
APPLICATION NO. : 10/806060
DATED : December 29, 2009
INVENTOR(S) : Richert et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 616 days.

Signed and Sealed this

Ninth Day of November, 2010

David J. Kappos
*Director of the United States Patent and Trademark Office*